(12) United States Patent
Kobayashi

(10) Patent No.: US 8,321,047 B2
(45) Date of Patent: Nov. 27, 2012

(54) SUBSTRATE PROCESSING SYSTEM AND SUBSTRATE PROCESSING DEVICE

(75) Inventor: Hirohito Kobayashi, Kawasaki (JP)

(73) Assignee: Canon Anelva Corporation, Kawasaki-shi (JP)

( * ) Notice: Subject to any disclaimer, the term of this patent is extended or adjusted under 35 U.S.C. 154(b) by 106 days.

(21) Appl. No.: 12/850,742

(22) Filed: Aug. 5, 2010

(65) Prior Publication Data
US 2011/0004334 A1 Jan. 6, 2011

Related U.S. Application Data

(63) Continuation of application No. PCT/JP2009/069475, filed on Nov. 17, 2009.

(30) Foreign Application Priority Data

Dec. 29, 2008 (JP) .................. 2008-335778

(51) Int. Cl.
*B65G 43/00* (2006.01)
(52) U.S. Cl. .......... 700/112; 901/2; 118/719; 118/723 R
(58) Field of Classification Search .................. 700/112; 901/2; 118/719, 723 R
See application file for complete search history.

(56) References Cited

U.S. PATENT DOCUMENTS

| | | | |
|---|---|---|---|
| 5,838,121 A | 11/1998 | Fairbairn et al. | |
| 6,413,320 B2 * | 7/2002 | Maher et al. .................. | 118/719 |

FOREIGN PATENT DOCUMENTS

| | | |
|---|---|---|
| JP | 1-303736 A | 12/1989 |
| JP | 6-114698 A | 4/1994 |
| JP | 8-255735 A | 10/1996 |
| JP | 10-275848 A | 10/1998 |
| JP | 11-121584 A | 4/1999 |
| JP | 2002-016120 A | 1/2002 |

OTHER PUBLICATIONS

International Search Report dated Dec. 2, 2009, issued in counterpart International Application No. PCT/JP2009/069475.

* cited by examiner

*Primary Examiner* — Tejal Gami
(74) *Attorney, Agent, or Firm* — Fitzpatrick, Cella, Harper & Scinto

(57) ABSTRACT

A substrate processing system capable of extending and changing a substrate processing module easily according to changes of processing contents for a substrate. An embodiment is the system including a main device and sub-devices. A transfer controlling part includes an acquiring part that acquires transfer-destination specifying information that includes additional information identifying at least a local address and a substrate processing device to which the local address belongs, and that specifies a substrate transfer destination uniquely within the main device and the sub-devices, a judging part that judges which one of the main device, and the sub-devices is the substrate transfer destination based on the specifying information acquired by the acquiring part, and a local transfer part that transfers the substrate to a process chamber connected to a transfer chamber of its own device by using the address allocated uniquely within the own device.

1 Claim, 10 Drawing Sheets

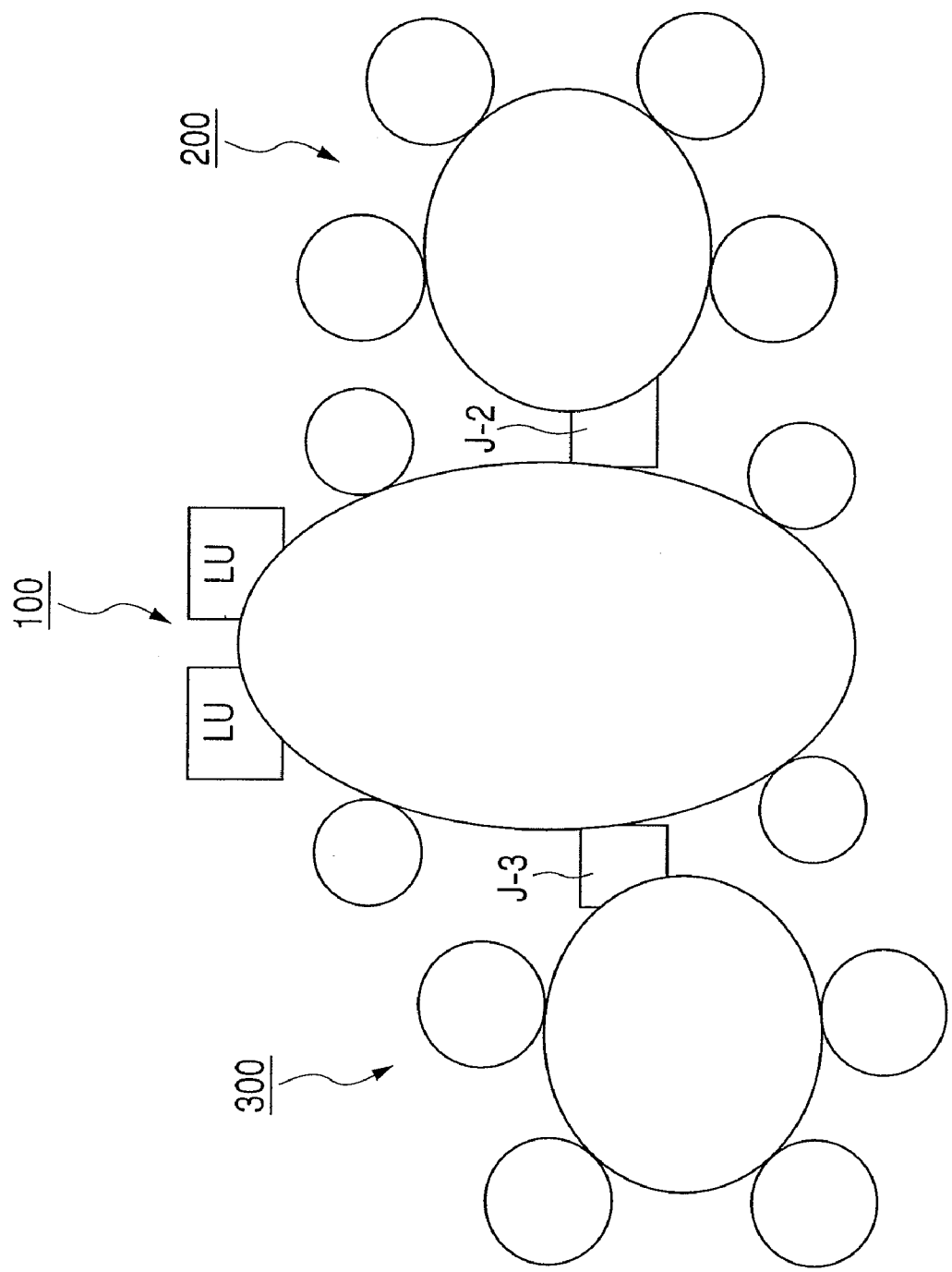

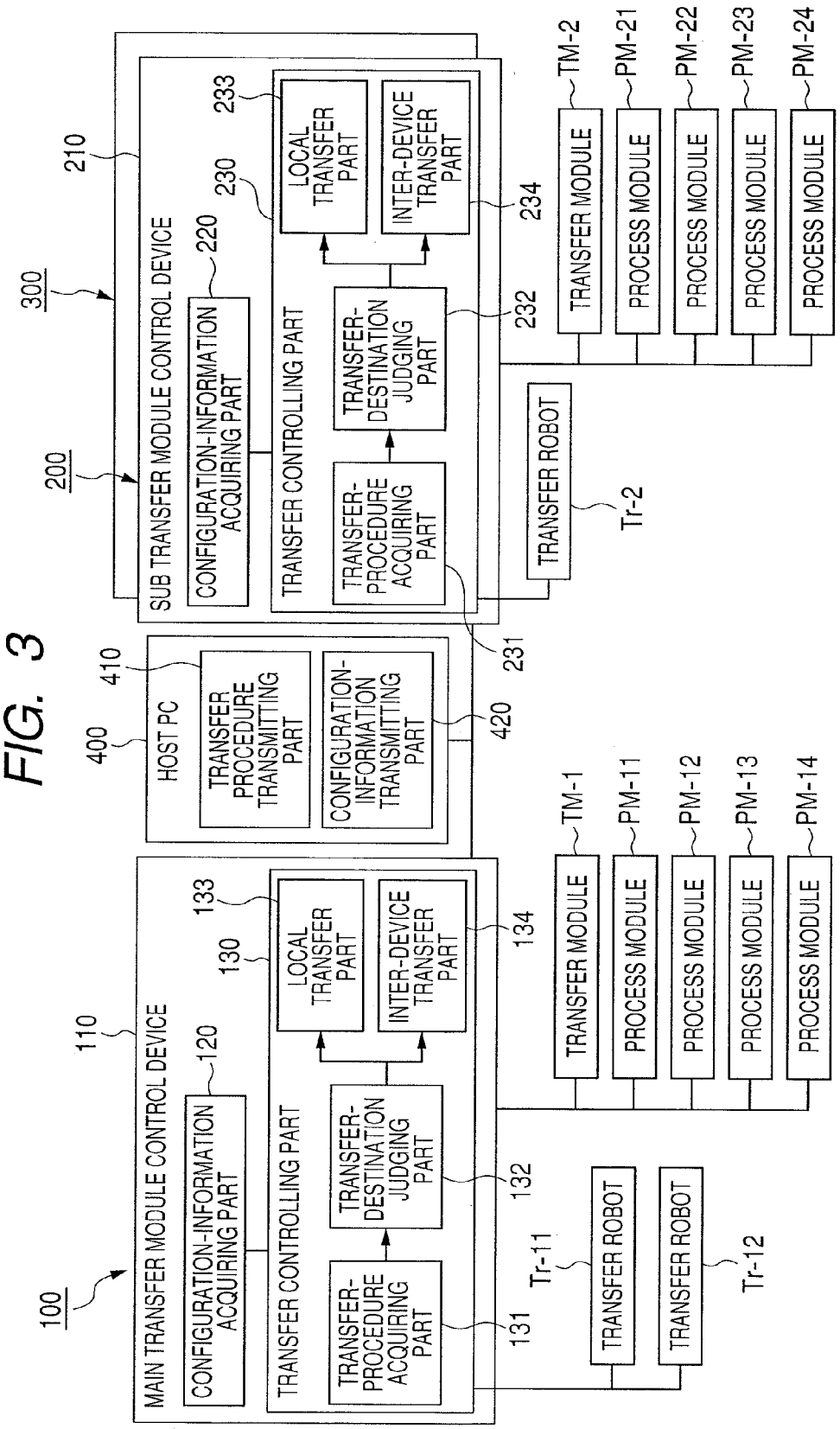

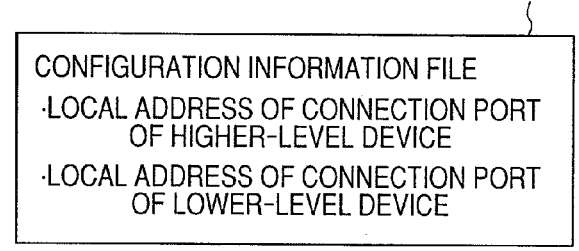
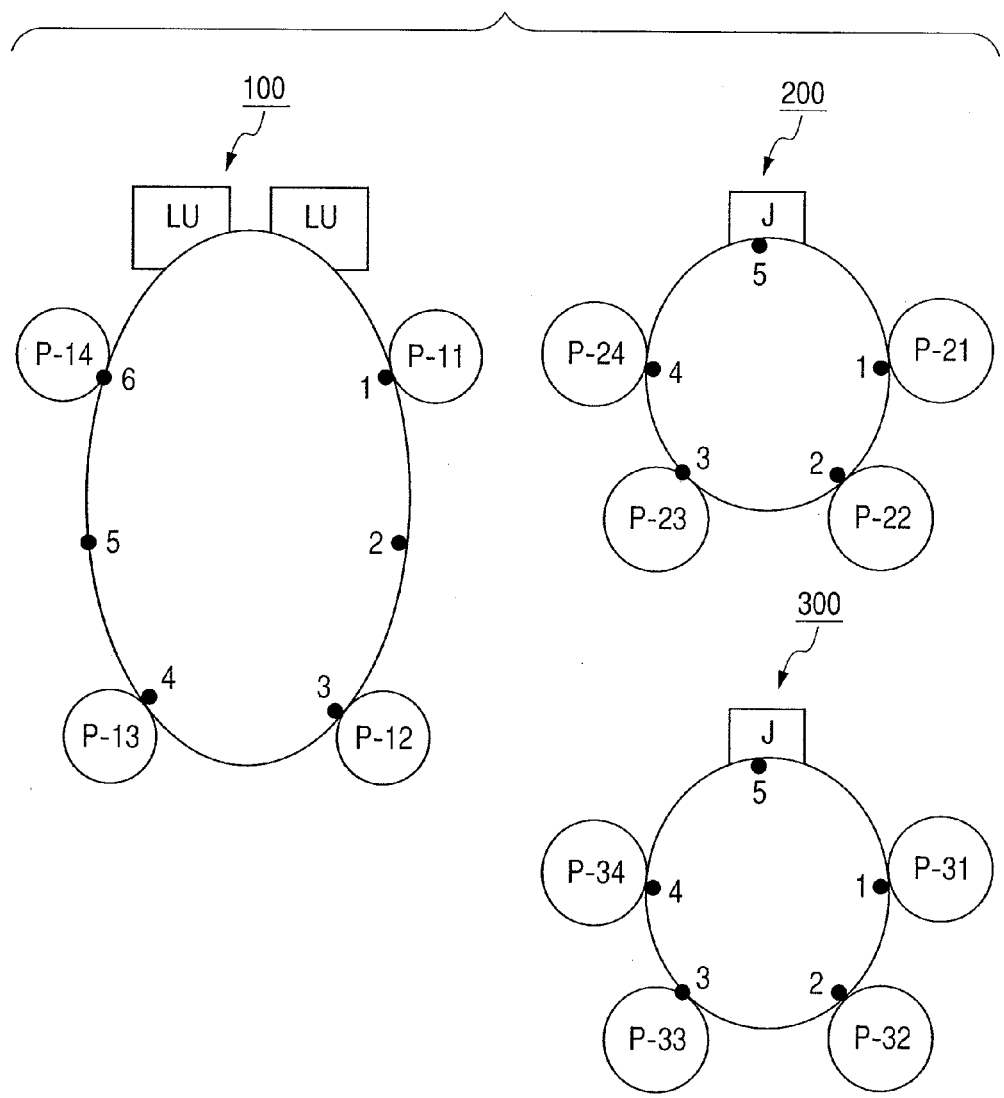

SUBSTRATE PROCESSING SYSTEM AND SUBSTRATE PROCESSING DEVICE

CROSS-REFERENCES TO RELATED APPLICATIONS

This application is a continuation application of International Patent Application No PCT/JP2009/069475, filed on Nov. 17, 2009, the entire contents of which are incorporated by reference herein.

This application also claims the benefit of priority from Japanese Patent Application No. 2008-335778 filed Dec. 29, 2008, the entire contents of which are incorporated herein by reference.

TECHNICAL FIELD

The present invention relates to a substrate processing system and a substrate processing device capable or easily making additional installation and changes in accordance with changes, for example, of processing contents for a substrate.

BACKGROUND ART

Conventionally, as a substrate processing device that manufactures electronic parts, such as a semiconductor device and a memory element, there is known a cluster type substrate processing device with a plurality of substrate processing modules connected to a transfer module provided with a transfer robot capable of transferring a substrate, as discussed in Japanese Laid-Open Patent Application No. H10-275848.

SUMMARY OF THE INVENTION

However, in a case of a device as illustrated in the '848 document, it is impossible to connect thereto substrate processing modules in a number more than the maximum connection number of the transfer module.

In such a case, in order to add substrate processing modules, it is necessary to change the transfer module in such a way as to change a transfer chamber to one having a shape that has a larger number of connections, and as to increase the number of the transfer chambers to add transfer robots therein. In this case, however, a program, for example, of a transfer control device that controls the transfer robot must be modified as the transfer robot is additionally installed, and in some situations, needed was the same amount of time and effort as to manufacture a new transfer module.

The present invention has been made in view of the above-mentioned problems, and has an object to provide a substrate processing system capable of easily extending and changing the substrate processing module in accordance with changes of processing contents for a substrate.

In order to achieve such an object, the present invention provides a substrate processing system having a first and a second substrate processing device, each comprising a transfer chamber capable of connecting a process chamber for performing processing on a substrate, a transfer robot located within the transfer chamber for transferring the substrate to the process chamber connected to the transfer chamber, and a transfer control means for controlling the transfer robot, wherein the transfer chambers of the first and second substrate processing devices are connected to each other, wherein the transfer control means of the first and second substrate processing devices each includes a local transfer part controlling the transfer robot so as to transfer a substrate to the process chamber connected to the transfer chamber of its own device by using a local address allocated uniquely to a substrate transfer destination within the own device, and wherein the transfer control means of the first substrate processing device includes a transfer-information acquiring means for acquiring transfer-destination specifying information that includes at least the local address and additional information capable of identifying the substrate processing device to which the local address belongs, and that uniquely specifies the substrate transfer destination within the first and second substrate processing devices, and a transfer-destination judging part capable of judging which one of the first and second substrate processing devices is the substrate transfer destination based on the transfer-destination specifying information acquired by the transfer-information acquiring means.

The present invention is a substrate processing device comprising a transfer chamber capable of connecting a process chamber for performing processing on a substrate and another substrate processing device, a transfer robot located within the transfer chamber for transferring the substrate to the process chamber connected to the transfer chamber, and a transfer control means for controlling the transfer robot, wherein the transfer control means includes a transfer-information acquiring means for acquiring transfer-destination specifying information that includes at least a local address allocated uniquely to a substrate transfer destination within its own device, further includes arbitrarily additional information capable of identifying a substrate processing device to which the local address belongs, and uniquely specifies the substrate transfer destination within the own device and the other substrate processing device connected to the transfer chamber, a transfer-destination judging part capable of judging which substrate processing device is the substrate transfer destination according to the transfer-destination specifying information acquired by the transfer-information acquiring means, a local transfer part that controls the transfer robot so as to transfer the substrate to a process chamber connected to the transfer chamber of its own device by using the local address allocated uniquely to the substrate transfer destination within the own device when the substrate transfer destination is within the own device as the judgment result of the transfer-destination judging part, and an inter-device transfer part that transfers the substrate to the other substrate processing device when the substrate transfer destination is within the other substrate processing device as the judgment result of the transfer-destination judging part.

Furthermore, the present invention is a substrate processing device comprising a transfer chamber having a plurality of connection ports and capable of connecting other substrate processing devices to at least one of the plurality of connection ports, means for, when the other substrate processing device is connected to the transfer chamber, acquiring first information for its own device to recognize whether the own device is a first device located in an uppermost stream of substrate transfer or whether it is a second device in a lower stream side than the first device in a flow of the substrate transfer, and recognizing, based on the first information, whether the own device is the first device or the second device, and at least one of a substrate transfer means for the first device used when its own device is recognized to be the first device, and a substrate transfer means for the second device used when it is recognized to be the second device, wherein a local address is allocated uniquely to each of the plurality of connection ports, wherein the substrate transfer means for the first device includes means for acquiring second information for identifying a position of the connection port that will be a substrate transfer destination in a configuration with the other substrate processing device being connected to the transfer chamber, the second information including third information with respect to the local address corresponding to the connection port to which the substrate is transferred, and fourth information for identifying the substrate processing device to which the local address belongs, means for judging the substrate processing device that will be the substrate transfer destination based on the acquired second information, means for transferring, when the substrate transfer destination is within its own device as the judgment result, the substrate to the connection port corresponding to the local address based on the third information included in the second information, and means for when the substrate transfer destination is the substrate processing device, other than its own device as the judgment result, transferring the substrate to one of the other substrate processing devices so as to transfer the substrate to the substrate processing device identified by the fourth information, and outputting a transfer command by which the substrate is transferred to the connection port identified by the third information in the substrate processing device identified by the fourth information, to the one of the other substrate processing devices, and wherein the substrate transfer means for the second device includes means for acquiring the transfer command, and means for acquiring a local address corresponding to the connection port to which the substrate is transferred from the acquired transfer command, and transferring the substrate to the connection port corresponding to the acquired local address.

According to the present invention, the substrate processing system can be used as one set with the number of connections of process modules increased merely by connecting an additional transfer module to an arbitrary position of the original transfer module without changing the configuration of the transfer module. Therefore, a cost for modifying the transfer module accompanying addition of process modules, for example, can be suppressed, and it is possible to deal with changes promptly.

BRIEF DESCRIPTION OF THE DRAWINGS

FIG. 2 is a figure illustrating a general view of a substrate processing system according to the present embodiment;

FIG. 3 is a figure illustrating a functional block of the substrate processing system according to the present embodiment;

FIG. 4 is a figure illustrating a configuration example of configuration information according to the embodiment of the present invention;

FIG. 5 is a figure illustrating an example of a local address according to the embodiment of the present invention;

DESCRIPTION OF THE EMBODIMENTS

An embodiment of the present invention will be described with reference to figures.

[Regarding a Configuration of a Substrate Processing System and a Substrate Processing Device]

Figure 1:
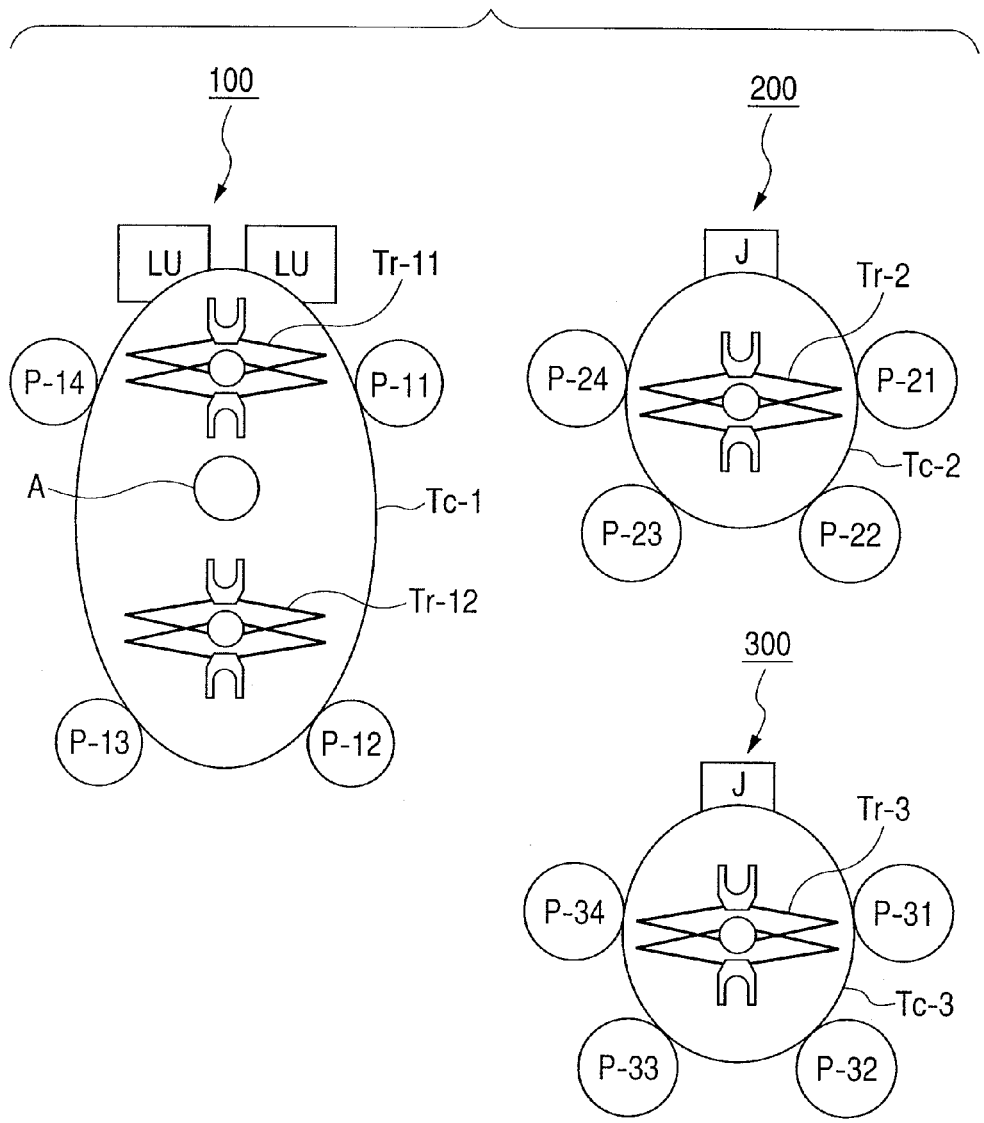
FIG. 1 is a figure illustrating a general view of a main device and sub-devices according to an embodiment of the present invention.

FIG. 1 is a figure illustrating a general view of a first substrate processing device 100 (hereafter called a "main device"), and a second and a third substrate processing device 200 and 300 (hereafter called "sub-devices"), according to the present embodiment.

As for the main device 100 of FIG. 1, process chambers P-11 to P-14 are connected via connection ports to a transfer chamber Tc-1, in which transfer robots Tr-11 and Tr-12 are disposed. Although not illustrated, the transfer chamber Tc-1 of the main device 100 of FIG. 1 has six connection ports, and six process chambers P are connectable thereto. The transfer chamber Tc-1 is connected to a substrate supplying chamber (not shown) via a load-lock/unload-lock chamber LU. A substrate can be introduced in the transfer chamber Tc-1 through the load-lock/unload-lock chamber LU.

The transfer robots Tr-11 and Tr-12, in the present embodiment, each have a rotatable and stretchable arm. They transfer the substrate to the predetermined process chamber P-11 to P-14. In the figure, reference symbol A denotes an alignment device, which is provided for carrying out substrate handover between the transfer robots Tr-11 and Tr-12, and for carrying out displacement correction, for example, of the substrate. The transfer chamber Tc-1 is provided with components, such as an exhaust pump and a driving source of the above alignment device, and is provided with a control device, such as a PLC, which controls each component so as to execute a substrate transfer operation. What are associated with processing in the transfer chamber Tc, including these, are called a transfer module, as a whole.

The process chambers P are chambers for processing the substrate and include, for example, a film-forming chamber capable of film formation by a sputtering method and a CVD (Chemical Vapor Deposition) method, an etching chamber capable of dry etching, or the like, and a temperature controlling chamber capable of heating and cooling. The process chamber P of the present embodiment is provided with substrate processing members individually, such as an exhaust pump, a power supply for plasma generation, and a gas introduction system, and connects a control device, such as a PLC, for controlling each of these substrate processing members so as to perform predetermined processings on the substrate. In the present embodiment, what are associated with these predetermined processings on the substrate, including the process chamber P, are called a process module, as a whole.

Also, the sub-device 200, similar to the main device 100, is configured such that process chambers PM-21 to PM-24 are connected, via connection ports, to a transfer chamber Tc-2 with a transfer robot Tr-2 disposed therein, and that the substrate is able to be transferred by the transfer robot Tr-2. Also, the sub-device 300 is configured, in the same way, such that process chambers PM-31 to PM-34 are connected, via connection ports, to a transfer chamber Tc-3 disposed therein, and that the substrate is able to be transferred by the transfer robot Tr-3. A detailed description thereof is omitted because the function and configuration of each process robot Tr are nearly the same as that of the main device.

FIG. 2 illustrates a general view of the substrate processing system according to the present embodiment, which includes the main device 100, and the sub-devices 200 and 300 mentioned above.

The main device 100 and the sub-device 200 are connected via a joint J-2 connected to each other's connection port, and the main device 100 and the sub-device 300 are connected via a joint J-3 connected to each other's connection port. That is, the connection port of the transfer chamber Tc-1 of the main device 100 is connectable with one independent substrate processing device in the place of the process chamber P. In the present embodiment, using a plurality of substrate processing devices, a sequence of substrate processings in vacuum are able to be carried out without being exposed to the atmosphere.

FIG. 3 illustrates a functional block diagram of the substrate processing system according to the present embodiment. The substrate processing system of FIG. 3 includes a host PC 400 besides the main device 100 and the sub-devices 200 and 300 mentioned above. The host PC 400 is connected with the main device 100, and sub-devices 200 and 300, and the sub-devices 200 and 300 are connected with each other, via a network based on the standards such as a LAN (Local Area Network) and RS-232C, and, thereby, data communication is possible. Specifically, the host PC 400 includes a transfer-procedure transmitting part 410 that transmits transfer procedure data specifying a transfer order and a transfer destination of the substrate (described later), and a configuration-information transmitting part 420 that transmits configuration information (described later).

The main device 100 further includes a main-device controlling device 110, which is provided, for example, with a calculation processing device, such as a personal computer, and a driver for converting the calculation processing result into various electrical signals.

The main-device controlling device 110 includes a configuration-information acquiring part 120 acquiring the configuration information transmitted from the host PC 400, and a transfer controlling part 130 controlling the transfer robots Tr-11 and Tr-12. Although not illustrated, there is also provided a control part for controlling each component of process modules PM-11 to PM-14 and the transfer module TM-1, such as the exhaust pump.

The transfer controlling part 130, in the present embodiment, includes a transfer-procedure acquiring part 131, a transfer-destination judging part 132, a local transfer part 133, and an inter-device transfer part 134. The transfer-procedure acquiring part 131 acquires the transfer procedure data transmitted from the host PC 400. The transfer-destination judging part 132 judges which one of the process chambers P connected to the substrate processing device 100, 200 and 300 is the substrate transfer destination, based on the transfer procedure data acquired by the transfer-procedure acquiring part 131. When the transfer-destination judging part 132 judges that the substrate transfer destination is the process chamber P of the main device 100, the local transfer part 133 outputs a transfer command for the process chamber P according to the designation to the transfer robots Tr-11 and Tr-12 provided in the transfer chamber Tc-1 of the main device 100. When the transfer-destination judging part 132 judges that the substrate transfer destination is not within the main device 100, the inter-device transfer part 134 outputs the transfer command to the sub-devices 200 and 300, which will be the transfer destination.

The sub-device 200 includes a sub-device controlling device 210, and, similar to the main-device controlling device 110, is provided, for example, with a calculation processing device such as a personal computer, and a driver for converting the calculation processing result into various electrical signals.

The sub-device controlling device 210 includes a configuration-information acquiring part 220 acquiring the configuration information transmitted from the host PC 400, and a transfer controlling part 230 controlling the transfer robot Tr-2. Although not illustrated, there is also provided a control part for controlling each component of process-modules PM-11 to PM-14 and the transfer module TM-1, such as the exhaust pump.

The transfer controlling part 230 includes a transfer-procedure acquiring part 231, a transfer-destination judging part 232, a local transfer part 233, and an inter-device transfer part 234.

Here, the transfer-procedure acquiring part 231 of the sub-device 200 acquires the transfer procedure data transmitted as the transfer command from the inter-device transfer part 134 of the main device 100 as the higher-level device. Although described in full detail afterwards, the transfer procedure data, unlike the transfer procedure data that the main device 100 acquires from the host PC 400, includes, as the designation of the substrate transfer destination, only the process chambers P-21 to P-24 connected to the sub-device 200, or the process chamber P connected to the substrate processing device connected to the sub-device 200 as a lower-level device. The transfer-destination judging part 232 determines the device that will be the substrate transfer destination based on the transfer procedure data acquired by the transfer-procedure acquiring part 231. When the substrate transfer destination is the process chamber P connected to the sub-device 200, the local transfer part 233 outputs the transfer command of the substrate to the transfer robot Tr-2 located in the transfer chamber Tc-2 of the sub-device 200. When the substrate transfer destination is not the sub-device 200, the transfer command of the substrate is output to the substrate processing device of the transfer destination. As for the sub-device 300, a description thereof will be omitted, because the configuration is the same as that of the sub-device 200.

[Regarding Various Kinds of Data]

Subsequently, various kinds of data will be described.

FIG. 4 illustrates a configuration example of configuration information.

The configuration information, which has a format of a configuration information file F as illustrated in FIG. 4, for example, is created for each of the main device 100 and the sub-devices 200 and 300. The corresponding file is transmitted to corresponding substrate processing devices 100, 200 and 300 from the host PC 400. In an example of FIG. 4, the configuration information file F includes the information on the connection port to which a higher-level substrate processing device is connected and the information on the connection port to which a lower-level substrate processing device is connected. Acquisition methods of the configuration information file F in the host PC 400 include inputting by a user, receiving from an external device and creating in the host PC 400, for example.

Here, higher-level or lower-level means hierarchy of the system set up according to a flow of the substrate transfer when a plurality of substrate processing devices is connected and used as one system. By acquiring this configuration information, each substrate processing device recognizes its own positioning in the system (recognizes whether itself is the higher-level device or the lower-level device), and carries out processing accordingly. Basically, a device near a substrate introducing source is set up as the higher-level, and a device connected to this is set up as the lower-level. In the present embodiment, the substrate processing device connected to the substrate supplying chamber is set up as the main device 100, and the substrate processing device connected to this is set up as the sub-device 200 or 300. Based on the configuration information, it is possible to also recognize to which position of itself other substrate processing devices are connected.

That is, in the present embodiment, each substrate processing device stores each of processing procedures of the higher-level device and the lower-level device (for example, FIGS. 9A and 9B, etc., described later) in a storage part such as a memory in advance. Then, in the case of using a plurality of substrate processing devices in combination as required, each substrate processing device acquires the corresponding configuration information and recognizes whether itself is the higher-level device or the lower-level device. Therefore, each substrate processing device, because of having stored the processing procedure of the higher-level device and the lower-level device, is able to act as the device (the higher-level device or the lower-level device) with which itself should deal by reading out and carrying out the processing procedure which itself should execute based on the above recognition. In this way, because each substrate processing device recognizes the device (the higher-level device or the lower-level device) with which itself should deal based on the configuration information for each of the combinations of the substrate processing devices, each substrate processing device can function as the device to be dealt with out the user creating and installing the processing procedure newly according to the above combinations.

The information on the connection port is the one just capable of identifying the connection port, and, for example, a local address given uniquely to the connection port within the transfer chamber of each substrate processing device is used as the information on the connection port. FIG. 5 illustrates examples of the local address. Consecutive numbers (1 to 5) are given to a plurality of connection ports provided in the transfer chamber Tc-2. In FIG. 5, a local address is indicated near a black circle in the transfer chamber Tc-2. As a matter of course, a setting method of the local address may not be limited to this, and the address may be not consecutive, but may be discontinuous numbers, and may be a character, etc. Similarly, in other substrate processing devices 100 and 300, the local address is given uniquely to the connection port in the substrate processing device. The local address should just be unique in each of the substrate processing devices 100 to 300, and these may duplicate each other.

Specifically, in the main device 100, the sub-devices 200 and 300 are connected to the connection ports, of which local addresses are '2' and '5', respectively. To other connection ports (local addresses: '1', '3', '4' and '6'), the process chambers P are connected without other substrate processing devices being connected. Therefore, as for the main device 100, created is the configuration information file F that does not include the information on the connection port of the higher-level device (or includes the information corresponding to "no connection"), but includes '2' and '5' as the information on the connection port of the lower-level device, and the file F is transmitted to the main device 100. For example, the user inputs the information with respect to the combination of the substrate processing devices (for example, the information indicating that the devices 200 and 300 that will become the sub-devices are connected to the connection ports having the local addresses '2' and '5' of the device 100, which will become the main device) through an input operation part including a keyboard, by which a predetermined command or data, etc. are input, or various switches, etc., which the host PC 400 is provided with. The host PC 400, upon receiving the user input, creates the configuration information file F mentioned above, and the configuration-information transmitting part 420 transmits the created configuration information file F to the main device 100. When the configuration-information acquiring part 120 acquires such configuration information file F, the transfer controlling part 130 recognizes that itself is the higher-level device by that "the local address of the connection port of the higher-level device" is not included, and recognizes the position of the connection port to which the lower-level device is connected based on "the local address of the connection port of the lower-level device".

On the other hand, in the sub-device 200, to the connection port of the local address '5' is connected the main device 100, and to other connection ports (local addresses '1' to '4') is connected only the process chambers P without other substrate processing devices being connected. Therefore, the configuration information file F, which specifies '5' as the information on the connection port of the higher-level device, and does not include the information on the connection port of the lower-level device (or includes the information corresponding to "no connection"), is transmitted to the sub-device 200. That is, through the input operation part, the user inputs the information with respect to the combination of the substrate processing devices (for example, the information indicating that the device 100, which will become the main device, is connected to the connection port having the local address '5' of the device 200, which will become the sub-device.) The host PC 400, upon receiving the user input, creates the configuration information file F mentioned above, and the configuration-information transmitting part 420 transmits the created configuration information file F to the sub-device 200. When the configuration-information acquiring part 220 acquires such a configuration information file F, the transfer controlling part 230 recognizes the position of the connection port to which the higher-level device is connected, based on "the local address of the connection port of the higher-level device", and recognizes that itself is the lower-level device by that "the local 10 address of the connection port of the lower-level device" is not included.

The same configuration information file F is created with respect to the sub-device 300, and is transmitted to the sub-device 300.

Figure 6:
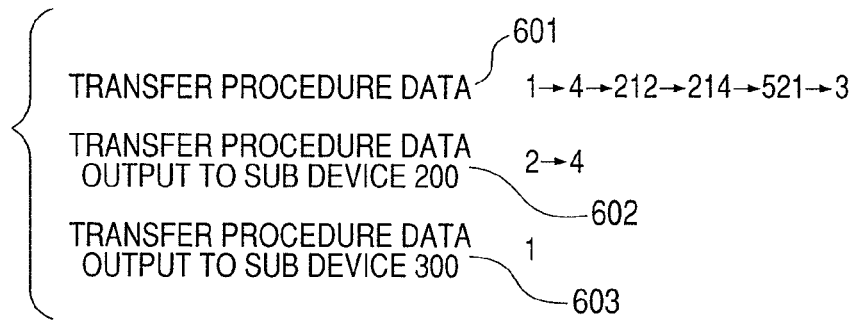
FIG. 6 is a figure for illustrating an example of transfer procedure data according to the embodiment of the present invention.

FIG. 6 shows a figure for explaining an example of the transfer procedure data.

The transfer procedure data, which specifies the transfer order and the substrate transfer destination according to a process flow of the substrate, as mentioned above, is transmitted to the main device 100 from the host PC 400. The host PC 400 acquires the transfer procedure data by methods such as input from the user, reception from an external device, or creating in the host PC 400. In an example illustrated by reference numerals 601 and 602 of FIG. 6, the transfer procedure data is formed by combining transfer-destination specifying information ('1' and '212', etc., in the figure) capable of identifying uniquely the substrate transfer destination within the substrate processing system in the transfer order with a delimiter ('->' in the figure) sandwiched. As a matter of course, the transfer procedure data, which is not limited to such a configuration, may be one including a number data of the transfer order in association with the transfer-destination specifying information, for example, and may have a configuration that is formed with predetermined bit numbers, etc., and which does not include the delimiter, and may be one further including other information such as a transfer holding time, etc.

Figure 7:
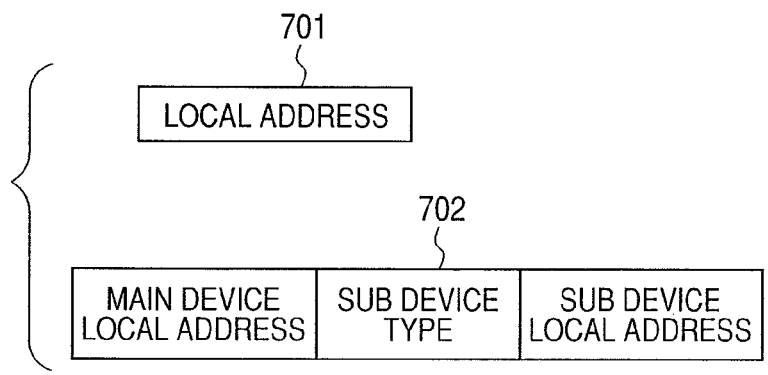
FIG. 7 is a figure illustrating a configuration example of transfer-destination specifying information according to the embodiment of the present invention.
Figure 8:
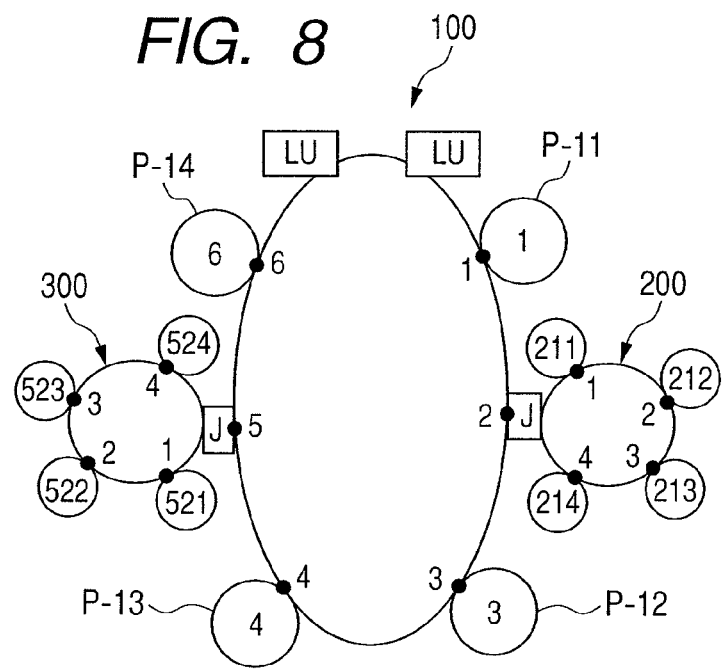
FIG. 8 is a figure for illustrating the transfer-destination specifying information according to the embodiment of the present invention.

FIG. 7 is a figure illustrating a configuration example of the transfer-destination specifying information, and FIG. 8 is a figure for illustrating the transfer-destination specifying information.

The transfer-destination specifying information is the information by which the substrate transfer destination can be identified within the substrate processing system. The present embodiment uses the information that can uniquely identify the connection port connected to the process chamber P, which will be the substrate transfer destination within the substrate processing system. FIG. 7 illustrates an example of the transfer-destination specifying information. Specifically, in the present embodiment, when the process chamber P of the main device 100 is the transfer destination, the local address of the connection port connected to the process chamber P is made to be the transfer-destination specifying information as it is, as illustrated by reference numeral 701 (reference numeral 701: the transfer-destination specifying information for the main device) in FIG. 7. On the other hand, when the process chamber P connected to the sub-device 200 or 300 is the transfer destination, the data combining the local address of the main device, a sub-device type and the local address of the sub-device is used as the transfer-destination specifying information as illustrated by reference numeral 702 (reference numeral 702: transfer-destination specifying information for the sub-device) in FIG. 7. As for the local address of the main device 100, used is the local address of the connection port, in the main device 100, to which the sub-device 200 or 300, which will be the substrate transfer destination is connected, and, for example, '2' will be used for the data destined to the sub-device 200, and '5' will be used for the data destined to the sub-device 300.

The sub-device type is used for the main device 100 to create the transfer command for the sub-device 200 or 300 according to the type of the sub-device. In the present embodiment, the sub-device type of the sub-device 200 is set to '1', and the sub-device type of the sub-device 300 is set to '2'. The local address of the sub-device is the local address of the connection port of the sub-device to which the process chamber P, which will be the substrate transfer destination, is connected.

Therefore, as an example of the transfer-destination specifying information illustrated in FIG. 7, if the substrate transfer destination is the process chamber P-11 of the main device 100, for example, the transfer-destination specifying information will be '1' according to the transfer-destination specifying information 701 as illustrated in FIG. 8. If the transfer destination is the process chamber P-23 of the sub-device 200, it will be '213' according to the transfer-destination specifying information 702, and if the transfer destination is the process chamber P-32 of the sub-device 300, it will be '522' according to the transfer-destination specifying information 702. When the transfer destination is the sub-device 200 or 300 in this example, a number at the left-hand side of the transfer-destination specifying information indicates a "main device local address", and the number at the center indicates a "sub-device type", and the number at the right-hand side indicates a "sub-device local address". In FIG. 8, the local address of the connection port is indicated near the black circle in each transfer chamber Tc, and the transfer-destination specifying information used when the substrate is transferred to the process chamber is indicated within each process chamber P.

Creation of the transfer-destination specifying information illustrated in FIG. 7 may be carried out as follows, for example. That is, through the input operation part, the user inputs the information with respect to the process chamber to which the user likes to transfer the substrate. When the user likes to use the process chamber of the main device 100, the user specifies the predetermined process chamber of the main device 100 through the input operation part. Since the local address is allocated to the main device 100, the host PC 400 creates the transfer-destination specifying information 701, including the local address corresponding to the user input. When the user likes to use the process chamber of the sub-device 200, the user inputs the local address of the main device 100 to which the sub-device 200 is connected, and the object device being the sub-device 200, and the local address corresponding to the process chamber to which the substrate is transferred within the sub-device 200 through the input operation part. The host PC 400 creates the transfer-destination specifying information 702 including the "main device local address", the "sub-device type" and the "sub-device local address" corresponding to the user input.

While the transfer-destination specifying information 701 for the main device includes only the local address, if it has been specified that the substrate processing device to be transferred is the main device (higher-level device) 100 when only the local address is included in the transfer-destination specifying information, it can be specified that the main device 100 transfers the substrate to the connection port corresponding to the local address of the main device 100. Therefore, in this case, although only the local address is included in the transfer-destination specifying information 701, it can be said that the transfer-destination specifying information 701 also substantially includes the information for identifying the substrate processing device to be the substrate transfer destination. Therefore, the transfer-destination judging part 132, in the case of analyzing the transfer-destination specifying information 701, can identify, as the substrate transfer destination, the connection port corresponding to the above local address of the main device 100, because only the local address is included in the transfer-destination specifying information 701.

Since the "main device local address" and the "sub-device type" are included in the transfer-destination specifying information 702 for the sub-device, the main device 100 is able to identify the sub-device to which the substrate is to be transferred, and because the "sub-device local address" is included therein, the sub-device is able to identify the position of the connection port to which the substrate is to be transferred within the sub-device. Therefore, the transfer-destination judging part 132, in the case of analyzing the transfer-destination specifying information 702, can identify, as the substrate transfer destination, the connection port included in the sub-device, which is connected to the connection port corresponding to the "main device local address" and which is identified by the "sub-device type", and the connection port corresponding to the "sub-device local address". Also, the transfer-destination judging part 232 judges the transfer destination based on the transfer-destination specifying information in the same way as mentioned above.

As another method of creating the transfer-destination specifying information, by allocating the transfer-destination specifying information to each connection port of each substrate processing device of a predetermined substrate processing system, a configuration table that correlates the allocated transfer-destination specifying information with local addresses of the each substrate processing device may be used.

In the case of using the above configuration table, for each of the combinations of a plurality of substrate processing devices, created is the configuration table that correlates the transfer-destination specifying information allocated to each connection port with the local address of the each substrate processing device in the substrate processing system after the substrate processing devices have been combined. For example, for the substrate processing system in which a plurality of the substrate processing devices is connected, as illustrated in FIG. 8, there is allocated the transfer-destination specifying information (for example, the transfer-destination specifying information having the configuration illustrated in FIG. 7) corresponding to each connection port (process chamber) of the substrate processing devices 100, 200 and 300. Then, created is the configuration table correlating the allocated transfer-destination specifying information with the local address of the connection ports of the substrate processing devices 100, 200 and 300, which is corresponding to the connection port specified by the transfer-destination specifying information, and the configuration table is stored in the host PC 400.

Therefore, for example, in the substrate processing system illustrated in FIG. 8, when the user likes to transfer the substrate to the process chamber P-11 connected to the local address '1' of the main device 100, the user carries out inputs to specify the local address '1' of the main device 100 through the input operation part. According to the user input, the host PC 400 reads out the information corresponding to the local address '1' of the main device 100 with 5 reference to the configuration table, and creates the transfer-destination specifying information '1'. In the substrate processing system illustrated in FIG. 8, when the user likes to transfer the substrate to the process chamber P-22 connected to the local address '2' of sub-device 200, the user carries out input to specify the local address '2' of the main device 200 through the input operation part. According to the user input, the host PC 400, with reference to the configuration table, reads out the information corresponding to the local address '2' of the main device 200, and creates the transfer-destination specifying information '212'.

At this time, the transfer-destination judging part 132, upon receiving the transfer-destination specifying information '1', for example, judges that the substrate is transferred to the connection port of the main device 100, because the information includes the local address only. The transfer-destination judging part 132, upon receiving the transfer-destination specifying information '212', for example, judges that the substrate is transferred to the sub-device 200 connected to the connection port of the local address '2' of the main device 100, because the left-hand side of the transfer-destination specifying information indicates '2' and the center indicates '1'. Since the right-hand side of the transfer-destination specifying information indicates '2', the judging part 132 judges that the substrate is transferred to the connection port of the local address '2' of the above sub-device 200. The transfer-destination judging part 232 also judges similarly.

In the case of carrying out the substrate processing successively in a plurality of process chambers, it is possible to create the transfer procedure data by disposing the corresponding transfer-destination specifying information according to the sequence of the above substrate processing. For example, when the user inputs, in a desired order, the process chamber to which the substrate is transferred by the input operation part, the host PC can create the transfer procedure data by disposing the corresponding transfer-destination specifying information along the above order.

That is, the local address mentioned above is unique within each of substrate processing devices 100 to 300, but it does not necessarily become unique within the substrate processing system. Therefore, by adding additional information capable of identifying to which substrate processing device the transfer destination is destined, the process chamber P of the different substrate processing device can be identified in the substrate processing system, and the substrate can be transferred thereto. In the transfer-destination specifying information for the sub-devices 200 and 300 mentioned above, the sub-device type and the local address of the main device are not necessarily indispensable, and may be changed to other additional information. However, using the local address of the main device provides the ability to identify to which substrate processing device the substrate should be transferred when a plurality of substrate processing devices is connected with the main device 100. When inputting the transfer procedure data, as for the main device 100, since it is possible to specify the local address like specifying the process chamber P, and to input the local address of the lower-level sub-device 200 or 300 in succession, there also exists an advantage that the user can easily understand.

In this way, because the substrate processing device can identify the substrate transfer destination in the substrate processing system to which the substrate processing device belongs by the transfer-destination specifying information, it can be said that the transfer-destination specifying information is the information for identifying the position of the connection port that will be the substrate transfer destination in the substrate processing system.

[Transfer Flow and Effect of the Present Invention]

Figure 9A:
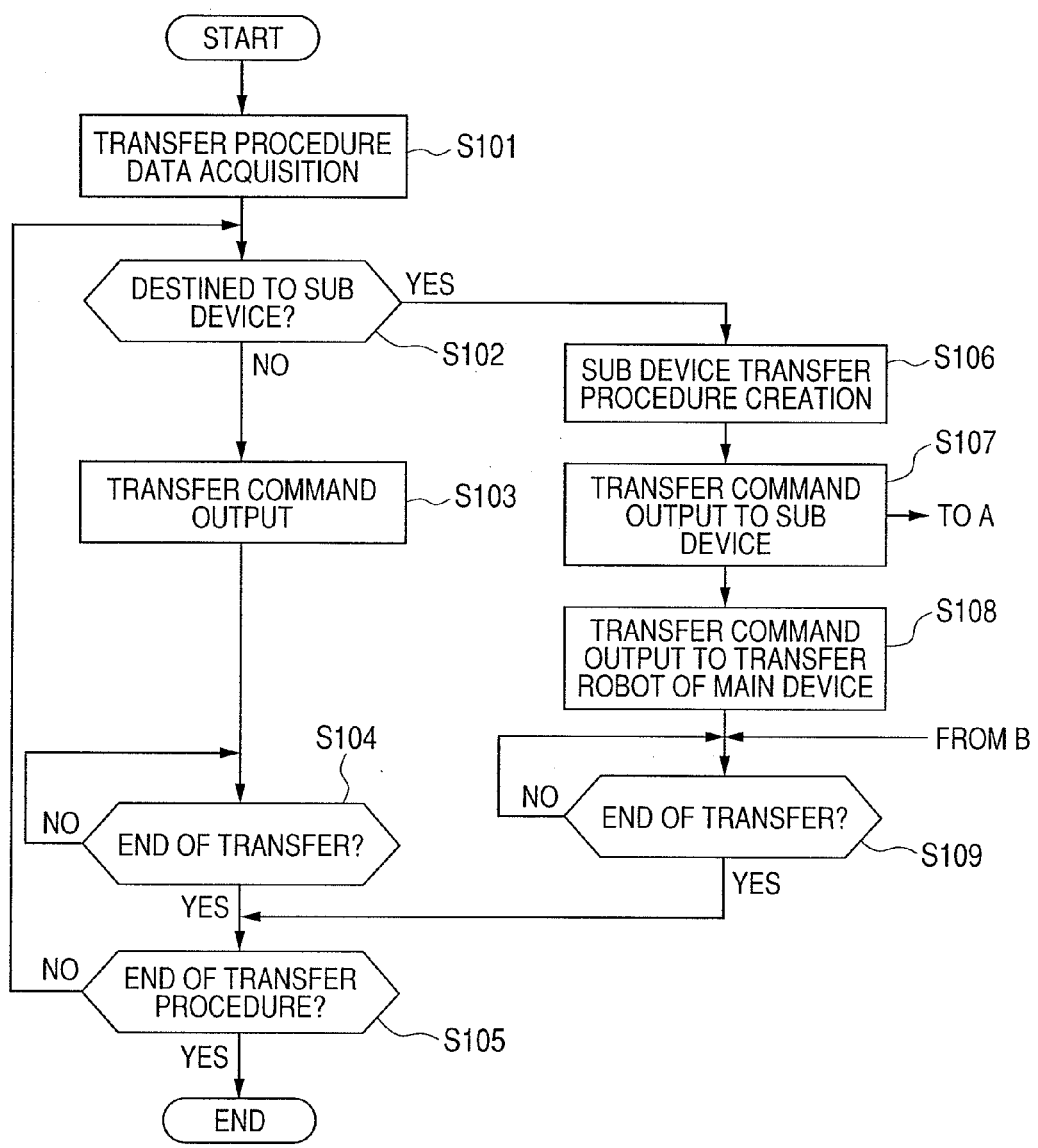
FIG. 9A is a flow chart illustrating a transfer operation of a substrate of the main device according to the embodiment of the present invention.
Figure 9B:
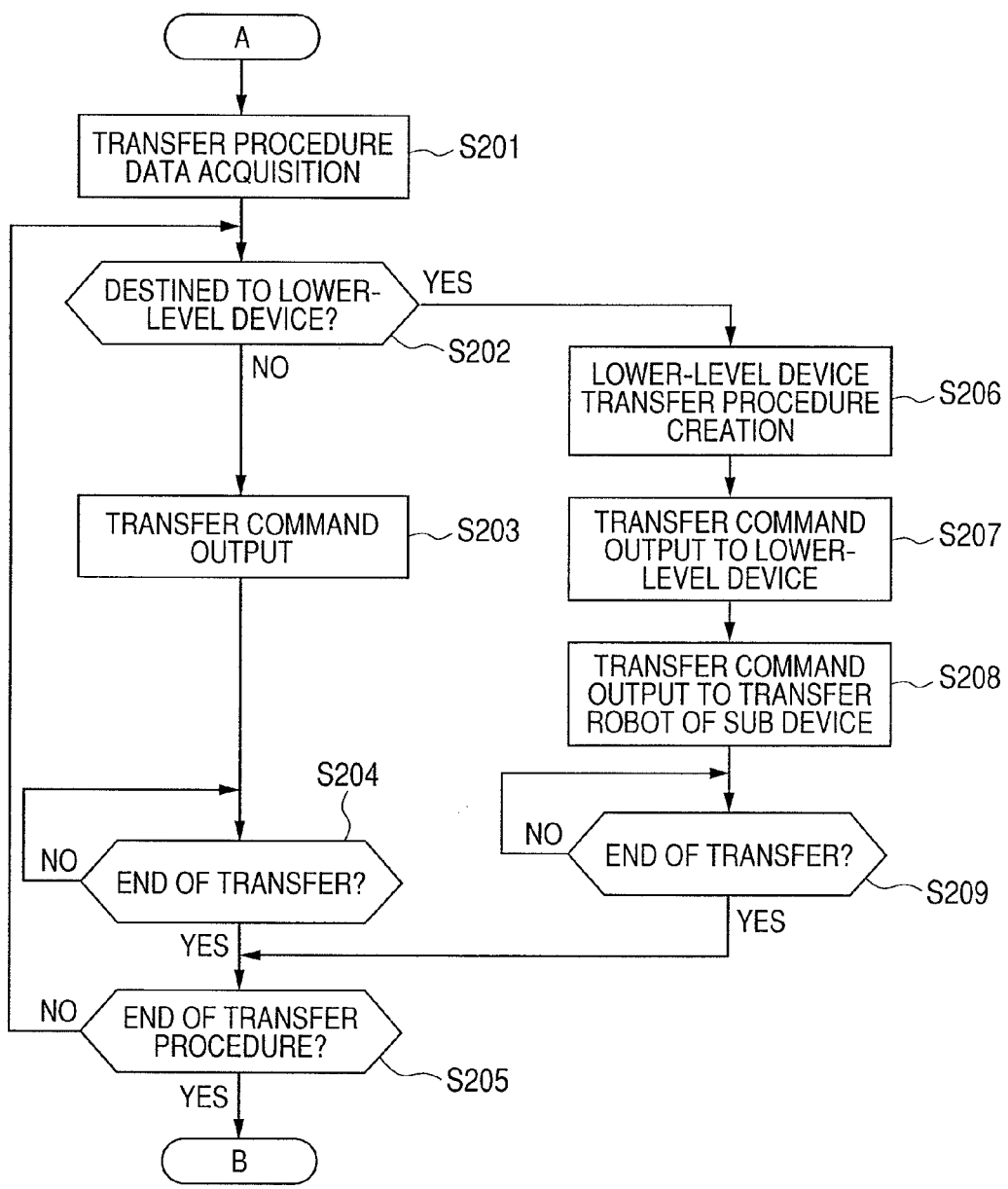
FIG. 9B is a flow chart illustrating a transfer operation of a substrate of the sub-device according to the embodiment of the present invention.

Subsequently, using a flow chart illustrated in FIGS. 9A and 9B, the substrate transfer operations of the main device 100 (FIG. 9A) and the sub-devices 200 and 300 (FIG. 9B) will be described. The configuration information has already been acquired by each substrate processing device, and the main device 100 shifts to an operation mode as the highest-level device by acquiring the configuration information not including the higher-level device, and the sub-devices 200 and 300 shift to an operation mode as the lower-level device by acquiring the configuration information indicating that the higher-level device is connected.

First, in the main device 100, the transfer-procedure acquiring part 131 acquires the transfer procedure data transmitted from the host PC 400 (step S101). Subsequently, the transfer-destination judging part 132 judges whether the transfer destination of the first transfer order is destined to the sub-device 200 or 300 (step S102) based on the transfer procedure data acquired in step S101. For example, in the case of the transfer procedure data 601 illustrated in FIG. 6, the transfer-destination judging part 132 judges that the transfer destination is destined to the main device 100 (step S102: No), because the first transfer-destination specifying information is '1', and the local transfer part 133 outputs, to the transfer robot Tr-11, the transfer command for the process chamber P-11 of the main device 100 (step S103). After that, when transferring the substrate by the transfer robot Tr-11 is finished, and the transfer controlling part 130 receives a transfer end signal (step S104), the transfer controlling part 130 judges whether the transfer procedure specified by the transfer procedure data (for example, the transfer procedure data 601) is finished (step S105). When the transfer procedure is not finished (No), the step returns to step S102, and it is judged whether the transfer destination of the next transfer procedure is destined to the sub-device 200 or 300. The steps subsequent to S102 are repeated until the transfer procedure is finished.

The above step is repeated, and, in the transfer procedure data 601, for example, the transfer-destination judging part 132 judges that the third transfer destination in the transfer order is destined to the sub-device 200 (step S102: YES), and, then, the following processings are carried out. That is, the transfer controlling part 130 judges whether the transfer destination of the next and subsequent transfer order (the fourth and subsequent) is also destined to the sub-device 200, and the transfer jobs destined to the sub-device 200 in succession is cutout from the transfer procedure data, and the transfer command (the transfer procedure data 602 output to the sub-device 200) is created (step S106). For example, in the case of the transfer procedure data 601 illustrated in FIG. 6, from that the transfer jobs destined to the sub-device 200 are consecutive at the third to fourth, the data (transfer-destination specifying information) of '212' and '214' are cutout, and the transfer command (the transfer procedure data 602) is created based on this and output to the sub-device 200 (step S107). That is, when the substrate is to be transferred to the connection port included in the sub-device 200 (300) in a predetermined order, the transfer controlling part 130 cutouts the transfer-destination specifying information with respect to the sub-device 200 from the transfer procedure data, and newly creates the transfer procedure data for the sub-device 200 (for example, the transfer procedure data 602), and transmits it to the sub-device 200.

Like this, when the substrate transfer destination is judged not to be its own device of the main device 100, the transfer controlling part 130, in the sub-device 200 identified to be the substrate transfer destination by the above transfer-destination specifying information, extracts the local address corresponding to the connection port to which the substrate is transferred as the transfer command that the substrate is to be transferred to the connection port identified by the transfer-destination specifying information, and transmits it to the sub-device 200.

At the same time, the inter-device transfer part 134 outputs, also to the transfer robots Tr-11 and 12 of the main device 100, the substrate transfer command for the sub-device 200 (step S108), and hands over the substrate to the transfer robot of the sub-device 200 through the connection port of the local address 2'. That is, in the present embodiment, the transfer procedure data has been specified according to procedures of processing for the substrate, and the handover operation of the substrate between the transfer robots is not specified in the case of carrying out the inter-device transferring. This portion is interpreted on the side of the transfer controlling part 130, and the substrate transfer command is created therein. Thereby, the user can create the transfer procedure data with consciousness of the process only. That is, even if a plurality of substrate processing devices is combined as desired, it becomes unnecessary to create newly the control program with respect to the substrate transfer corresponding to the combination and to incorporate it in each substrate processing device.

When the sub-device 200 receives the transfer procedure data 602 as illustrated in FIG. 6 by the transfer-procedure acquiring part 231 from the main device 100 (step S201), the transfer-destination judging part 232 judges whether the substrate transfer destination is the lower-level substrate processing device based on the acquired transfer procedure data 602 (step S202). When the destination is not a device of a further lower-level, and is within the sub-device 200 (step S202: NO), the local transfer part 233 outputs, to the transfer robot Tr-2, the transfer command for the destination connection port based on the transfer procedure data 602 acquired at step S201 (step S203). When the transfer is finished (step S204: YES), the transfer controlling part 230 judges whether all of the transfer procedures specified by the transfer procedure data 602 have been finished. Step S205, when the transfer procedure is not finished (step S205: NO), the operation proceeding of the step S202 and, thereafter, is repeated until the end.

When it is judged that the substrate transfer destination is the lower-level substrate processing device by the transfer-destination judging part 232 in step 202 (YES), the step proceeds to step S206. In step S206, when the transfer jobs destined to the lower-level substrate processing device are consecutive in the transfer procedure data transmitted from the main device 100, the transfer controlling part 230 extracts the consecutive transfer jobs from the transfer procedure data, and creates the transfer procedure data destined to the lower-level device. After that, the transfer controlling part 230 outputs this created transfer procedure data to the lower-level substrate processing device (step S207), and, at the same time, the inter-device transfer part 234 outputs, to the transfer robot Tr-2, the handover command of the substrate for the transfer robot Tr of the lower-level device (step S208). After that, when the transfer controlling part 230 receives the transfer end signal from the lower-level device (step s209: YES), the step proceeds to step S205, and the transfer processing is repeated until all of the transfer procedures received by the sub-device 200 are finished.

In the present embodiment, because the substrate processing device of the further lower-level is not connected to the sub-device 200, operations in steps S206 to S209 are not carried out in the sub-device 200, which acquires the transfer procedure data 602 illustrated in FIG. 6. Based on the transfer procedure data 602 illustrated in FIG. 6, the transfer controlling part 230 repeats the operations of steps S202 to S205, and transfers the substrate to the process chamber P connected to the connection port of the local addresses '2' and '4' in the sub-device 200, and, after that, returns the substrate with predetermined processing performed thereon to the main device 100.

In the main device 100, when the transfer controlling part 130 receives the transfer end signal from the sub-device 200 (step S109: YES), the step proceeds to step S105, and the subsequent operation proceeding of the step S102 is repeated until all the transfer procedures specified by the transfer procedure data (for example, the transfer procedure data 601) are finished. According to the transfer procedure data 601 illustrated in FIG. 6, because the substrate transfer destination becomes the sub-device 300 in the next transfer order (the fifth), the transfer procedure data 603 in which the local address '1' is specified, as illustrated in FIG. 6, is output to the sub-device 300. In the sub-device 300, the substrate is transferred to the process chamber P of local address '1' along with the flow illustrated in FIG. 9B, as with the sub-device 200. After that, returning to the main device 100, the substrate is transferred to the process chamber P of local address '3', and all the transfer procedures are finished.

As mentioned above, as for the substrate processing system according to the present embodiment, by connecting the independent transfer module TM (substrate processing device) mutually for a request for additional installation of the process module, the number of connections of the process modules can be made to increase without changing the configuration of each transfer module TM itself.

It is also possible to separate the connected substrate processing devices and to use them as a stand alone device, and the configuration of the substrate processing system can be changed flexibly. Because it is not necessary to manufacture the transfer module on a made-to-order basis, and it is possible to cope with a specification change by adding and deleting, etc., of a general-purpose transfer module, reduction of development cost, etc., can be promoted. Although it is secondary, since an independent control is performed individually within each connected device, there is also such an effect that parallel processing is carried out in view of inter-devices, and, therefore, tact is improved as the whole device.

As mentioned above, in the present embodiment, each substrate processing device, by acquiring the configuration information, can recognize whether itself is the higher-level device or the lower-level device, and can recognize to which connection port of itself other substrate processing devices are connected. While each substrate processing device can become the higher-level device and also become the lower-level device corresponding to a combination of a plurality of substrate processing devices, each substrate processing device, by using the configuration information, as in the present embodiment, can recognize positioning of itself (whether itself is the higher-level device or is the lower-level device) corresponding to the current combination, and can play an appropriate role.

Each substrate processing device, by acquiring the transfer-destination specifying information, can specify the position (position of the connection port) of the process chamber (process module) corresponding to predetermined processing in the substrate processing system, in which a plurality of substrate processing devices is connected, and can transfer the substrate to the process chamber suitable for the predetermined processing.

That is, the higher-level device, when the substrate transfer destination is its own device, in the analysis result of the transfer-destination specifying information, carries out control of transferring the substrate to the corresponding connection port in its own device (higher-level device) based on the transfer-destination specifying information.

On the other hand, the higher-level device, when the substrate transfer destination is the substrate processing device other than its own device, in the analysis result of the transfer-destination specifying information, carries out control of transferring the substrate to at least one of the substrate processing devices connected to the higher-level device, so that the substrate is transferred to a substrate transfer device having the connection port specified by transfer-destination specifying information. For example, in the substrate processing system in which a second lower-level device is further connected to a first lower-level device connected to the higher-level device, when the substrate transfer destination is the second lower-level device, the higher-level device transfers, based on the transfer-destination specifying information, the substrate to the first lower-level device so that the substrate is transferred to the second lower-level device. That is, the higher-level device carries out control of transferring the substrate to the higher-level device and the first lower-level device connected to the second lower-level device, so that the substrate is transferred to the substrate processing device (in this case, the second lower-level device) identified by the transfer-destination specifying information. The first lower-level device, based on the transfer-destination specifying information indicating which connection port of which substrate processing device is the substrate transfer destination, carries out control of transferring the substrate transferred from the higher-level device to the second lower-level device.

At this time, by disposing the transfer-destination specifying information along a desired substrate processing sequence (substrate processing recipe), the transfer procedure data can be created. When the main device 100 acquires the created transfer procedure data, the main device 100, based on each of the transfer-destination specifying information constituting the transfer procedure data, can identify the position of the process chamber corresponding to each processing of the above substrate processing sequence within the substrate processing system with a plurality of substrate processing devices combined. Therefore, even in the case of carrying out the substrate processing in the sub-device 200 or sub-device 300, the main device 100 can transfer the substrate to the sub-device 200 or sub-device 300 in accordance with the appropriate processing order of the above substrate processing sequence. Also, the sub-device 200 or the sub-device 300 can transfer the substrate to the appropriate process chamber based on each of the transfer-destination specifying information constituting the acquired transfer procedure data.

Incidentally, in the case of combining, as desired, a plurality of substrate processing devices prepared separately, constituting the substrate processing system and carrying out the desired substrate processing sequence, it is necessary, conventionally, for the user to create a control program for the substrate transfer corresponding to the combination and to install the control program in each substrate processing device.

However, according to the present embodiment, in every time of carrying out the above combination, each substrate processing device acquires the configuration information corresponding to the combination and recognizes whether itself is the higher-level device (substrate processing device located in an uppermost stream of the substrate transfer) against each substrate processing device, or whether itself is the lower-level device (the substrate processing device located in a lower stream side than the above higher-level device in the above substrate transfer). At this time, if each substrate processing device stores the control program as the higher-level device (for example, FIG. 9A) and the control program as the lower-level device (for example, FIG. 9B), each substrate processing device can achieve the function that itself should carry out in the above combination (function as the higher-level device and the lower-level device) based on the recognition acquired by analyzing the above configuration information. Furthermore, because each substrate processing device can identify the position of the process chamber in which the predetermined processing is to be carried out by using the transfer-destination specifying information, the appropriate processing can be carried out by transferring the substrate to the specified process chamber. For example, because the transfer-destination specifying information includes the information regarding to which connection port of which substrate processing device the substrate is to be transferred, the higher-level device (main device 100) and the lower-level device (sub-devices 200, 300) can transfer the substrate to the appropriate place (the process chamber which itself has, or other substrate processing devices), based on the above transfer-destination specifying information.

In this way, in the present embodiment, each substrate processing device recognizes whether itself is the higher-level device or the lower-level device and acts as the device to be operated by itself based on the configuration information, and each substrate processing device transfers the substrate to the desired process chamber based on the transfer-destination specifying information. Therefore, even in the case of carrying out the desired substrate processing sequence by combining, as desired, a plurality of substrate processing devices prepared separately, it is possible to transfer the substrate to the desired process chamber without newly creating and installing the control program of the substrate transfer. Therefore, it is possible to reduce the effort and cost required in the case of connecting a new substrate processing device to the prescribed substrate processing device (transfer module, for example) and to easily carry out extension and change of the substrate processing device.

Modified Embodiment

Figure 10A:
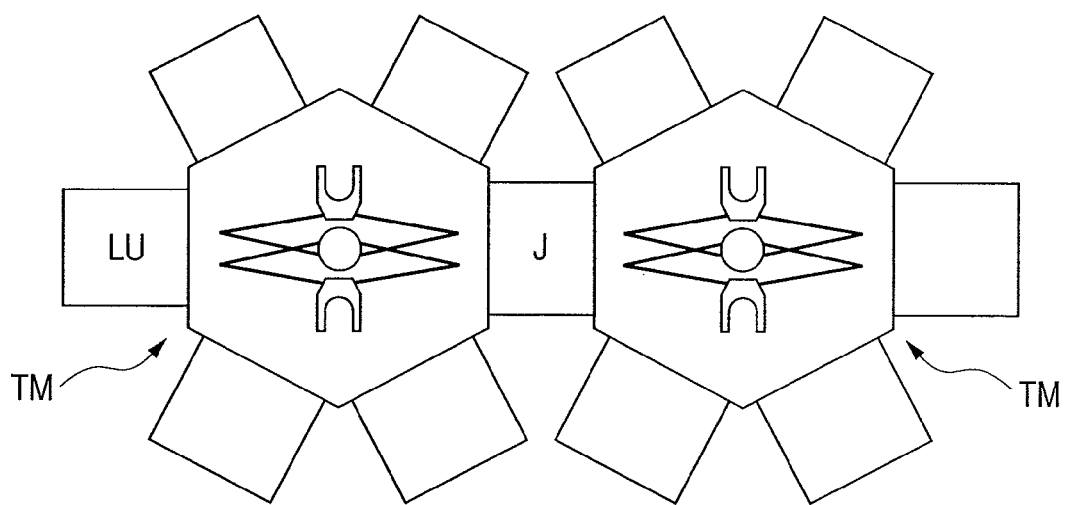
FIG. 10A is a figure illustrating another example of the present invention.
Figure 10B:
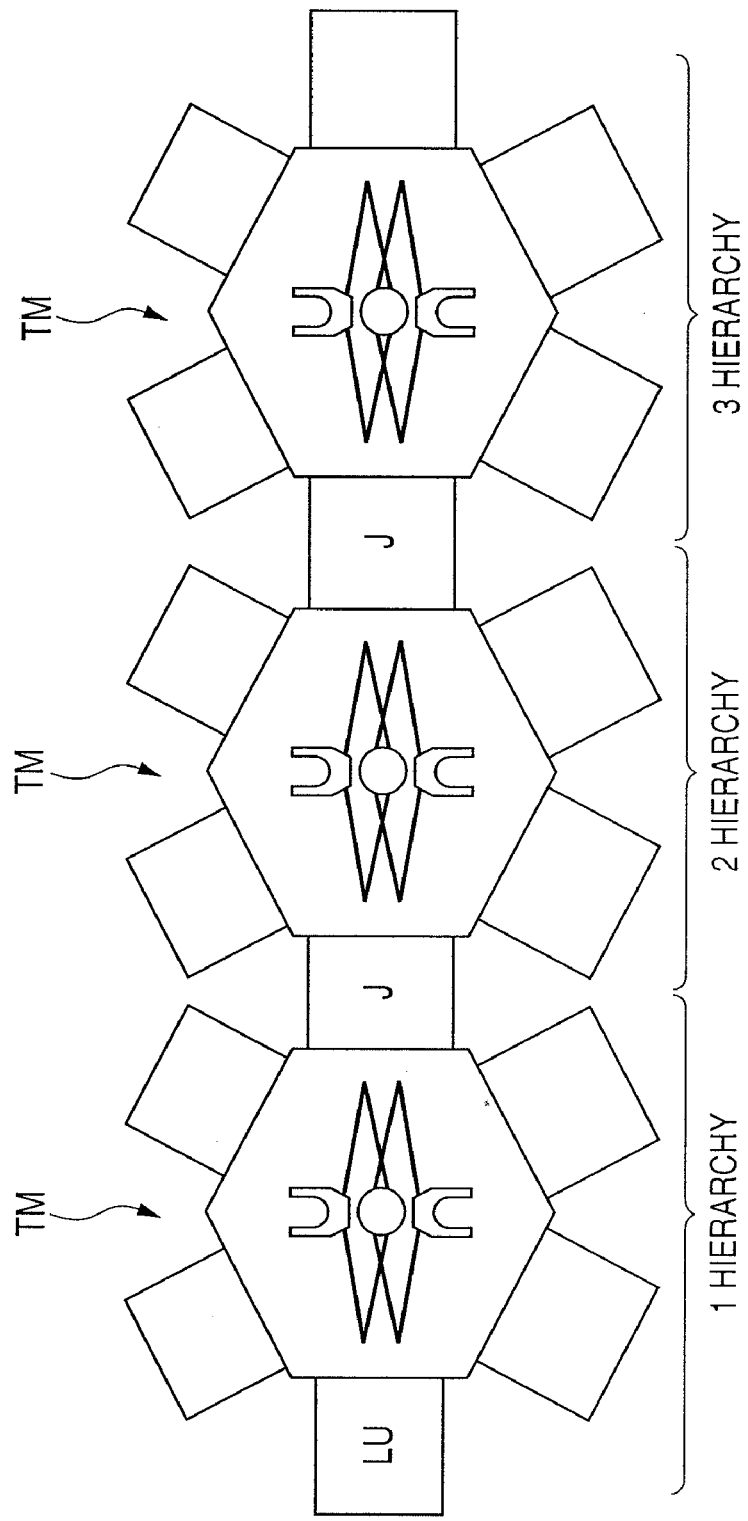
FIG. 10B is a figure illustrating another example of the present invention.
Figure 11:
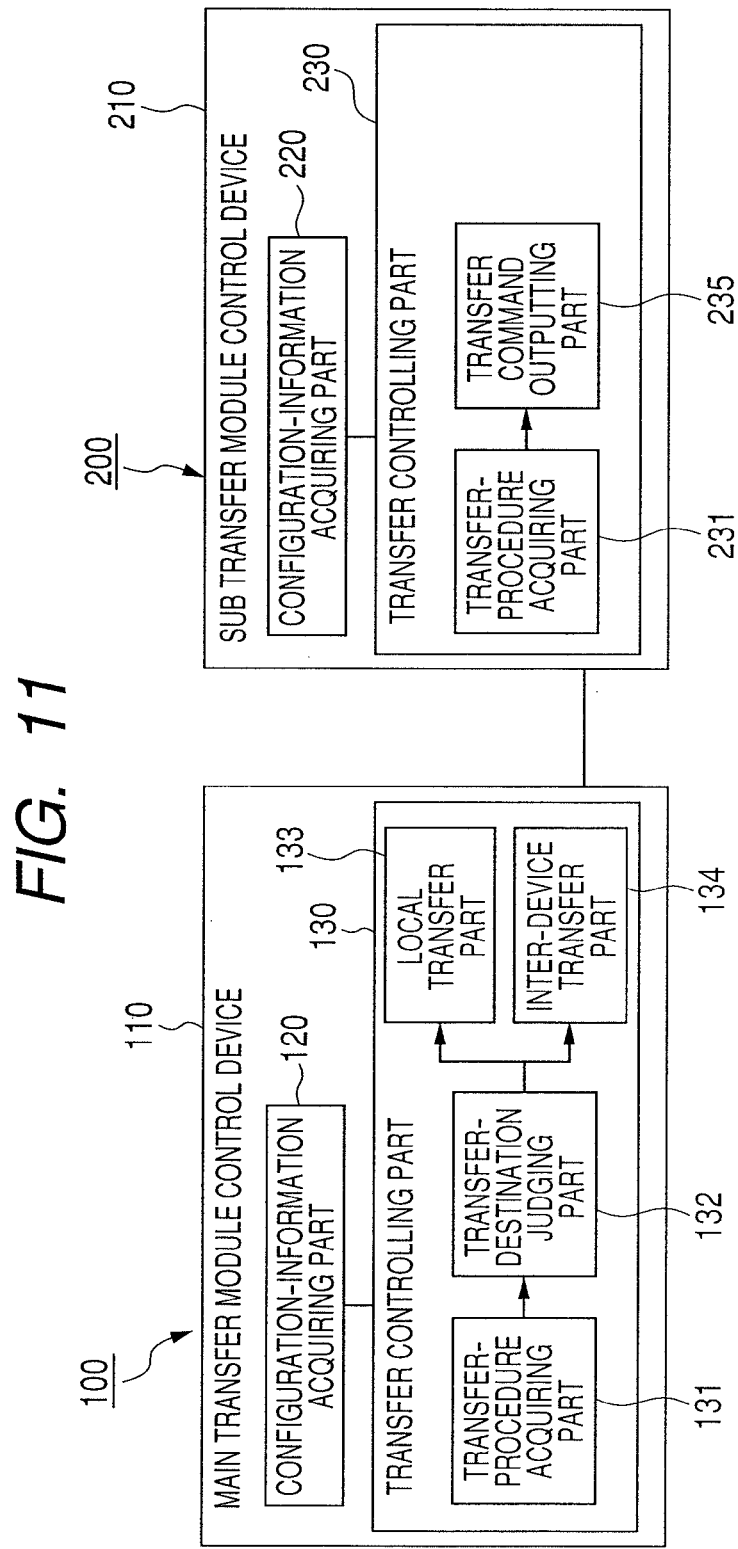
FIG. 11 is a functional block diagram illustrating another example of the present invention.

While an embodiment was described as mentioned above, applicability of the present invention is not limited to the above embodiment. For example, the substrate processing devices (transfer modules TM) of which the number of the connection ports is the same may be connected as illustrated in FIG. 10A, and the substrate processing devices may be connected so as to constitute three or more hierarchies, as illustrated in FIG. 10B. As illustrated in FIG. 1, the number of the transfer robots provided in one transfer module TM may be two or more, or may be one. As for the lower-level substrate processing device, one that does not have the function of judging whether the transfer destination is another substrate processing device may be connected, as illustrated in FIG. 11. In this case, the transfer command outputting part 235 creates the transfer command and outputs it to the transfer robot Tr-2 based on the 15 transfer procedure data acquired by the transfer-procedure acquiring part 231 of the sub-device 200.

Other Embodiments

While the host PC 400, the main device 100, and the sub-device 200 and the sub-device 300 are prepared separately in the embodiment mentioned above, as illustrated in FIG. 3, the function of the transfer procedure transmitting part 410 and the function of the configuration-information transmitting part 420 of the host PC 400 may be incorporated in the main device 100 or the sub-devices 200 and 300.

In addition, connection among the host PC 400 and the main device 100, the sub-device 200 and the sub-device 300 may be carried out locally via a LAN or RS-232, etc., as mentioned above, or may be carried out via a WAN (Wide Area Network), such as the Internet.

Furthermore, each substrate processing device is able to include both a main transfer module control device 110 and a sub transfer module control device 210 in the present invention. In this case, each of the substrate processing devices can function as both the higher-level device and the lower-level device according to the combination of the substrate processing devices. The substrate processing device may include either the main transfer module control device 110 or the sub transfer module control device 210. In this case, the substrate processing device may be used as the dedicated higher-level device or the dedicated lower-level device according to the control device provided thereto as the function. For example, the substrate processing device may be used as the dedicated higher-level device when including only the main transfer module control device 110, and may be used as the dedicated lower-level device when including only the sub transfer module control device 210.

The invention claimed is:
1. A substrate processing system comprising:
(A) a first substrate processing device including:
  (a) a first transfer chamber to which at least one process chamber is connected;
  (b) a first transfer robot located within the first transfer chamber, which transfers a substrate to the process chamber connected to the first transfer chamber or outside of the first transfer chamber; and
  (c) a first transfer controlling device having (i) a first transfer-procedure acquiring part adapted to acquire information of a substrate transfer destination from a host computer, (ii) a first transfer-destination judging part adapted to judge a transfer chamber to which a process chamber of the substrate transfer destination is connected, based on the information acquired by the first transfer-procedure acquiring part, (iii) a first local transfer part adapted to output a first transfer command for transferring the substrate to the process chamber of the substrate transfer destination to the first transfer robot, when the transfer chamber judged by the first transfer-destination judging part is the first transfer chamber, and (iv) a first inter-device transfer part adapted to output a second transfer command for transferring the substrate outside of the first transfer chamber to the first transfer robot, when the transfer chamber judged by the first transfer-destination judging part is not the first transfer chamber;
(B) a second substrate processing device including:
  (a) a second transfer chamber to which the first transfer chamber and at least one process chamber are connected;
  (b) a second transfer robot located within the second transfer chamber, which transfers a substrate to the process chamber connected to the second transfer chamber; and
  (c) a second transfer controlling device having (i) a second transfer-procedure acquiring part adapted to acquire the information of the substrate transfer destination output from the first inter-device transfer part as the second transfer command, (ii) a second transfer-destination judging part adapted to judge a transfer chamber to which a process chamber of the substrate transfer destination is connected, based on the information acquired by the second transfer-procedure acquiring part, and (iii) a second local transfer part adapted to output a third transfer command for transferring the substrate to the process chamber of the substrate transfer destination to the second transfer robot, when the transfer chamber judged by the second transfer-destination judging part is the second transfer chamber, wherein the second transfer controlling device further has a second inter-device transfer part adapted to output a fourth transfer command for transferring the substrate outside of the second transfer chamber to the second transfer robot, when the transfer chamber judged by the second transfer-destination judging part is not the second transfer chamber; and
(C) a third substrate processing device, the third substrate processing device including:
  (a) a third transfer chamber to which the second transfer chamber and at least one process chamber are connected;
  (b) a third transfer robot located within the third transfer chamber, which transfers a substrate to the process chamber connected to the third transfer chamber; and
  (c) a third transfer controlling device having (i) a third transfer-procedure acquiring part adapted to acquire the information of the substrate transfer destination output from the second inter-device transfer part as the fourth transfer command, (ii) a third transfer-des- tination judging part adapted to judge a transfer chamber to which a process chamber of the substrate transfer destination is connected, based on the information acquired by the third transfer-procedure acquiring part, and (iii) a third local transfer part adapted to output a fifth transfer command for transferring the substrate to the process chamber of the substrate transfer destination to the third transfer robot, when the transfer chamber judged by the third transfer-destination judging part is the third transfer chamber.

* * * * *